United States Patent [19]

Collver et al.

[11] Patent Number: 5,260,652

[45] Date of Patent: Nov. 9, 1993

[54] MAGNETORESISTIVE SENSOR WITH ELECTRICAL CONTACTS HAVING VARIABLE RESISTIVE REGIONS FOR ENHANCED SENSOR SENSITIVITY

[75] Inventors: Michael M. Collver, Afton; Charles H. Tolman, Bloomington, both of Minn.

[73] Assignee: Seagate Technology, Inc., Scotts Valley, Calif.

[21] Appl. No.: 857,619

[22] Filed: Mar. 25, 1992

[51] Int. Cl.⁵ .................... G01R 33/06; G11B 5/37; H01L 43/08
[52] U.S. Cl. .................... 324/252; 360/113; 338/32 R
[58] Field of Search ............ 324/207.21, 252, 235, 324/260, 261, 262; 307/309; 338/32 R; 360/113

[56] References Cited

U.S. PATENT DOCUMENTS

| | | |
|---|---|---|
| 4,012,781 | 3/1977 | Lin .................... 324/252 X |
| 4,024,489 | 5/1977 | Bajorek et al. .................... 324/252 X |
| 4,048,557 | 7/1977 | Chen .................... 324/252 X |
| 4,052,748 | 10/1977 | Kuijk .................... 324/252 X |
| 4,321,640 | 3/1982 | van Gestel .................... 360/113 |
| 4,476,454 | 10/1984 | Aboaf et al. .................... 338/32 R |
| 4,503,394 | 3/1985 | Kawakami et al. .................... 324/252 |
| 4,535,375 | 8/1985 | Mowry et al. .................... 324/252 X |
| 4,556,925 | 12/1985 | Suenaga et al. .................... 324/252 X |
| 4,663,685 | 5/1987 | Tsang .................... 360/113 |
| 4,686,472 | 8/1987 | Van Ooijen et al. .................... 324/252 |
| 4,713,708 | 12/1987 | Krounbi et al. .................... 360/113 |
| 4,785,366 | 11/1988 | Krounbi et al. .................... 360/113 |
| 4,803,580 | 2/1989 | Mowry .................... 360/113 |
| 4,878,140 | 10/1989 | Gill et al. .................... 360/113 |
| 4,894,741 | 1/1990 | French .................... 360/113 |
| 4,899,240 | 2/1990 | McClure .................... 360/113 |
| 4,949,039 | 8/1990 | Grünberg .................... 324/252 |
| 4,956,736 | 9/1990 | Smith .................... 360/113 |
| 4,967,298 | 10/1990 | Mowry .................... 360/113 |

Primary Examiner—Gerard R. Strecker
Assistant Examiner—Warren S. Edmonds

[57] ABSTRACT

A magnetoresistive sensor having a magnetization vector M and a current density vector J which form an angle of approximately 45°. Magnetic flux, which enters an active region of the magnetoresistive sensor approximately perpendicular to the magnetization vector M, propagates across the active region with substantially constant length thereby producing a rectangular shaped read sensitivity function. The current density vector J is directed with electrical contacts adjacent the active region which have high resistance regions and low resistance regions.

17 Claims, 4 Drawing Sheets

5,260,652

MAGNETORESISTIVE SENSOR WITH ELECTRICAL CONTACTS HAVING VARIABLE RESISTIVE REGIONS FOR ENHANCED SENSOR SENSITIVITY

BACKGROUND OF THE INVENTION

The present invention relates to a magnetoresistive head for reading magnetically encoded information. In particular, the present invention relates to a magnetoresistive sensor having an improved readback characteristic.

Magnetoresistive sensors are used to read back magnetically encoded information. In a magnetoresistive sensor, a sense current is passed through a magnetoresistive element. The sense current causes a voltage drop due to a resistance of the magnetoresistive element. The presence of a magnetic field causes the resistance of the magnetoresistive element to change. This change in resistivity can be detected by measuring the voltage drop across the magnetoresistive element.

The sense current in the active region of the magnetoresistive element may be represented by a current density vector J. Additionally, the active region has a magnetization vector, M. To obtain a linear output of the magnetoresistive sensor, the magnetization vector M and the current density vector J should form an angle near 45°. This arises because the output voltage is a function of the cosine squared of the angle between J and M which has a maximum slope at 45°.

Obtaining a 45° angle between M and J is accomplished by either rotating M or rotating J with respect to the easy axis (EA) of the magnetoresistive element. The easy axis is defined as the position of the magnetization vector when all orientation influences are absent, with two rest positions being 180° apart. Rotation of the magnetization vector M is achieved by applying an external magnetic field, such as a permanent magnet built into the head structure. Additionally, current carrying paths built into the head structure, coupled magnetic films, or soft adjacent layers can be used to rotate the magnetization vector M. The current density vector J typically is perpendicular to contact edges used to contact the active region of the magnetoresistive element.

Performance of magnetoresistive sensors can be determined by measuring a read sensitivity function. The read sensitivity function is a graph of sensor output obtained while a "microtrack" propagates across the surface of the head. A microtrack is a source of magnetic flux which is small in width relative to the active region of the head. A microtrack is an analytical device used to measure sensitivity of a magnetoresistive sensor. Additionally, magnetic flux enters the sensor in a direction perpendicular to the magnetization vector M. An ideal read sensitivity function would have a rectangular shape. In practice, it generally has a triangular or trapezoidal shape which will reduce track density due to offtrack interference.

A magnetoresistive sensor having an improved head sensitivity function would be an important contribution to the art.

SUMMARY OF THE INVENTION

The present invention is a magnetoresistive sensor having a read sensitivity function with a substantially square shape and increased peak output level. In the present invention, a magnetoresistive sensor includes a magnetoresistive element having an active region. The active region has a magnetization vector M. First and second contacts are electrically coupled to the active region. The first and second contacts are spaced apart and have generally parallel edges. The magnetization vector M of the active region is generally perpendicular to the edge of the first contact and the edge of the second contact. The active region includes a current density vector J. The current density vector J forms a 45° angle with the magnetization vector M. A second design of the present invention has J in the active region generally perpendicular to the edges of the first and second contact, and vector M forming a 45° angle with vector J.

The present invention generates an essentially constant length sensing behavior as a microtrack moves across the active sensing region, creating a rectangular (or square) read sensitivity function. This provides a substantially constant length sensing area as a microtrack propagates across the active region. The magnetization vector M is perpendicular to flux entry and the current density vector J is generally 45° to the magnetization vector.

DETAILED DESCRIPTION OF THE PREFERRED EMBODIMENTS

In a magnetoresistive sensor used to read information from magnetic storage media, a sense current is applied to an active region of a magnetoresistive element. The direction of the sense current through the magnetoresistive element is represented by a current density vector J. The presence of a magnetic field in the magnetoresistive element causes a change in electrical resistance of the magnetoresistive element. The change in resistance of the magnetoresistive element causes a voltage drop across the element. By monitoring the voltage drop, information can be read back from magnetic storage media.

In addition to the current density vector J, magnetoresistive elements have a magnetization vector M. To linearize the output of a magnetoresistive element, the magnetization vector M and the current density vector J should form an angle near 45°. This is because the output voltage of the sensor is a function of the cosine squared of the angle between the two vectors. An angle of 45° will yield a nearly linear voltage response as the magnetic field changes.

The angle between the magnetization vector M and the current density vector J is $\phi$. Obtaining a $\phi$ of 45° can be accomplished by rotating either the magnetization vector M or the current density vector J relative to the other. Rotation of the magnetization vector M can be achieved by applying an external magnetic field to the magnetoresistive element. An external magnetic field can be created by placing permanent magnets in the sensor structure. The external magnetic field causes the magnetization vector M in the active region of the magnetoresistive element to be rotated. Additionally, current carrying paths built into the head structure, coupled magnetic films, and soft adjacent layers are ways of rotating the magnetization vector M. Additionally, it is possible to change the direction of the magnetization vector by changing the shape of the magnetoresistive sensor.

Figure 1:
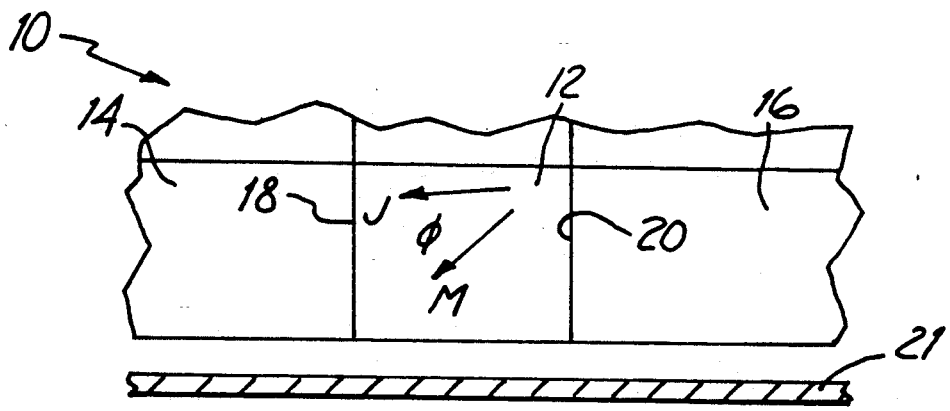
FIG. 1 shows a diagram of a prior art magnetoresistive sensor having a rectangular active region.

FIG. 1 is a diagram of a prior art magnetoresistive sensor 10. In magnetoresistive sensor 10, an active region 12 is connected to a first electrical contact 14 and a second electrical contact 16. Contact 14 and active region 12 form an edge 18. Contact 16 and active region 12 form an edge 20. Additionally, in FIG. 1 a magnetization vector M and a current density vector J are shown. Note that in FIG. 1, the angle $\phi$ is approximately 45°. Additionally, the current density vector J is perpendicular to edges 18 and 20. Sensor 10 senses magnetically encoded information carried in a magnetic storage medium 21. Magnetic flux from medium 21 enters active region 12 which changes the electrical resistivity of active region 12. The current flowing through active region 12 causes a voltage drop between contacts 14 and 16. This voltage drop is measured and converted into a data signal by readback circuitry (not shown).

Figure 2:
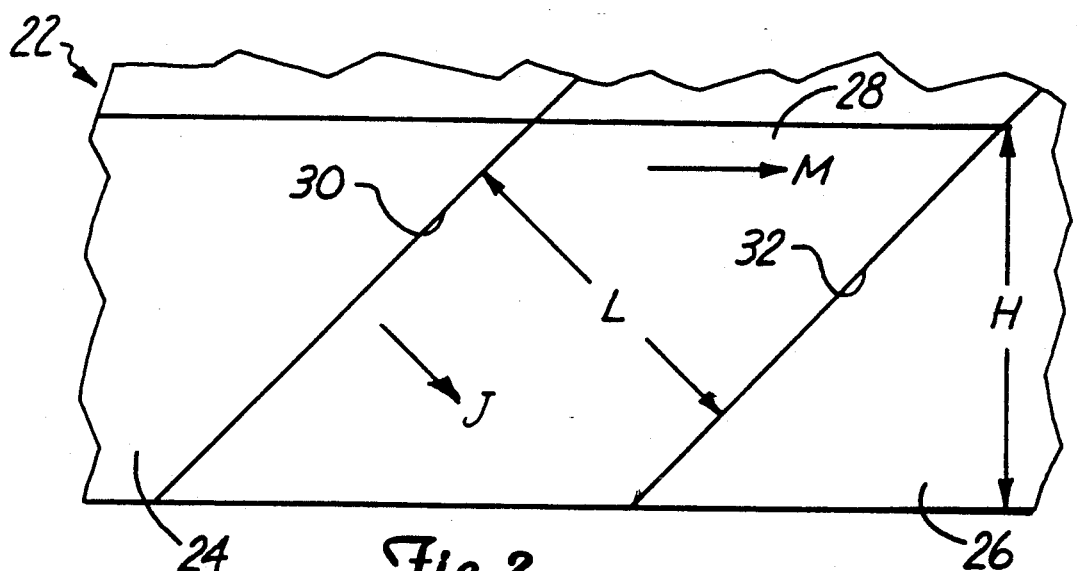
FIG. 2 is a diagram of a magnetoresistive sensor having a slanted contact configuration.

FIG. 2 is a diagram of a prior art magnetoresistive sensor 22 having a "slanted contact" design. This design is used to adjust the direction of the current density vector J. This technique is described in U.S. Pat. No. 4,803,580 entitled DOUBLEGAP MAGNETORESISTIVE HEAD HAVING AN ELONGATED CENTRAL WRITE/SHIELD POLE COMPLETELY SHIELDING THE MAGNETORESISTIVE SENSOR STRIP IN THE READ GAP which is incorporated herein by reference. Magnetoresistive sensor 22 includes a first contact 24 and a second contact 26 which form a parallelogram shaped active region 28. This design uses current biasing or rotation to affect the angle $\phi$ between J and M. In the current biasing technique, electrical contacts 24 and 26 are oriented at an angle relative to the length of the active region 28 such that the angle between the current density vector J and the magnetization vector M is approximately 45°. This design may be successfully employed if the resistances of first and second electrical contacts 24 and 26 are significantly less than the resistance of the active region 28 of the magnetoresistive element. Magnetoresistive sensor 22 includes an edge 30 between first electrical contact 24 and active region 28. Additionally, magnetoresistive sensor 22 includes an edge 32 between second electrical contact 26 and magnetoresistive element 28. Edges 30 and 32 along sides of active region 28 should form equipotential lines.

Given the two design approaches of magnetoresistive sensor 10 of FIG. and magnetoresistive sensor 22 of FIG. 2, we can now look at how magnetic flux is propagated through active regions 12 and 28, respectively. To do this, a "microtrack" can be used. The microtrack is, for example, less than about 1 micrometer wide. The microtrack moves along the bottom edge of the active region of the magnetoresistive element. For simplicity, consider flux propagation in a direction only perpendicular to the magnetization vector M (the highest permeability path) and assume that the output is proportional to the length of the path through the active region, (i.e. ignore magnetic decay length effects).

Figure 3:
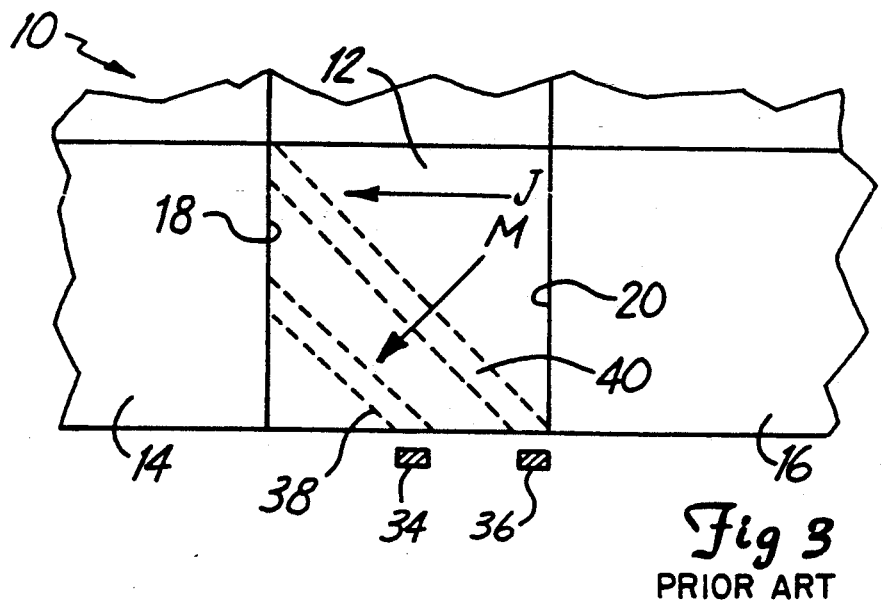
FIG. 3 is a diagram which shows a microtrack and the path that flux propagates relative to the prior art magnetoresistive sensor of FIG. 1.
Figure 4:
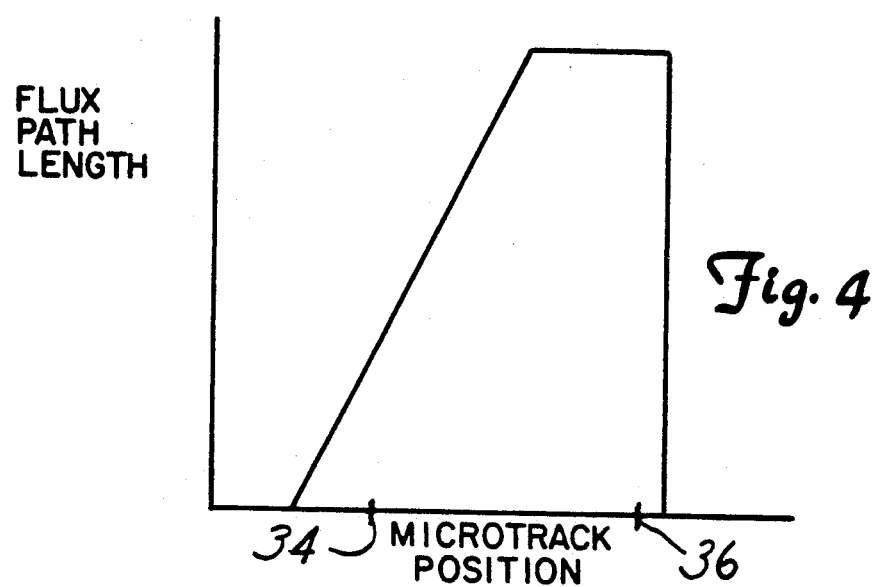
FIG. 4 is a graph of magnetic flux path length versus microtrack position for the flux propagation path of the magnetoresistive sensor of FIG. 3.

FIG. 3 shows prior art magnetoresistive sensor 10 of FIG. 1. In FIG. 3, a microtrack is shown at two different positions 34 and 36 relative to active region 12 of magnetoresistive sensor 10. Also shown in FIG. 3 are current density vector J and magnetization vector M of magnetoresistive sensor 10. A microtrack at a position 34 causes magnetic flux to enter active region 12 of magnetoresistive 10 along a magnetic flux path 38. Similarly, a microtrack at a position 36 results in magnetic flux entering active region 12 along a magnetic flux path 40. Note that magnetic flux path 38 is considerably shorter in length than magnetic flux path 40. Therefore, a graph of magnetic flux path length versus microtrack position is similar to the curve shown in FIG. 4. In FIG. 4, positions 34 and 36 are shown. FIG. 4 represents a head sensitivity curve for magnetoresistive sensor 10 shown in FIG. 3 when other effects that would modify the slopes have been ignored.

Figure 5:
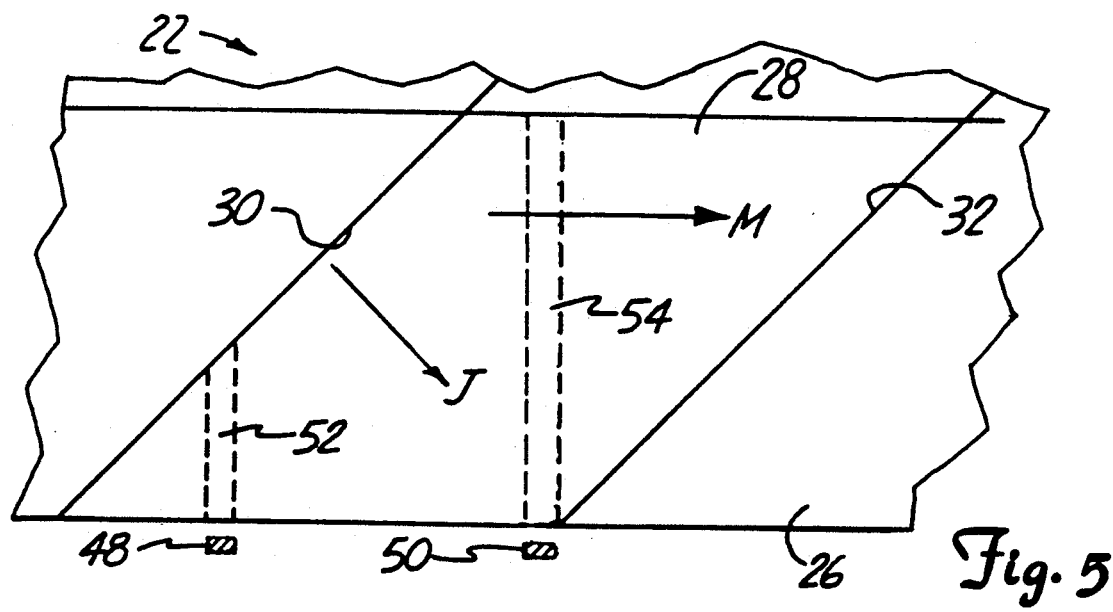
FIG. 5 is a diagram which shows a microtrack and the path that the flux propagates relating to the prior art magnetoresistive sensor of FIG. 2.
Figure 6:
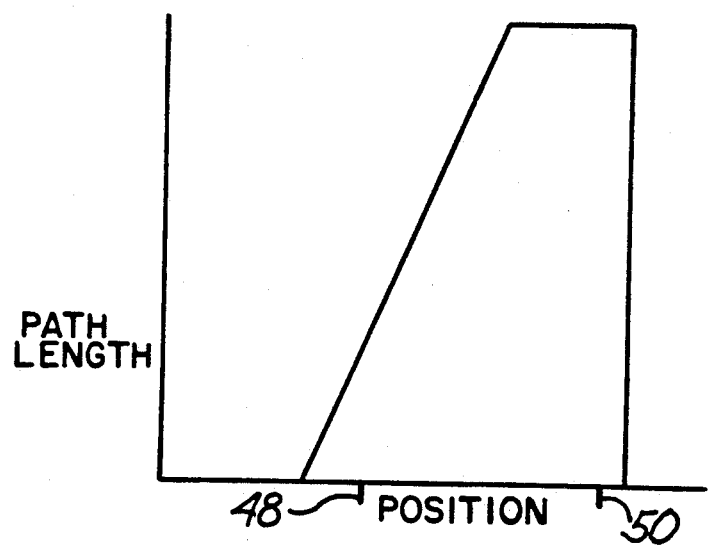
FIG. 6 is a graph of magnetic flux path length versus microtrack position for the sensor of FIG. 5.

FIG. 5 shows prior art magnetoresistive sensor 22 of FIG. 2 including a microtrack at positions 48 and 50. Microtrack position 48 induces magnetic flux in active region 28 of magnetoresistive sensor 22 along a magnetic flux path 52 shown in FIG. 5. Similarly, microtrack position 50 induces magnetic flux in active region 28 along a magnetic flux path 54. Note that magnetic flux paths 52 and 54 are perpendicular to the magnetization vector M in active region 28 of magnetoresistive sensor 22. FIG. 6 is a graph of magnetic flux path length for magnetoresistive sensor 22 of FIG. 5 versus microtrack position. The graph of FIG. 6 corresponds to a head sensitivity function for magnetoresistive head 22 of FIG. 5. In FIG. 6, microtrack positions 48 and 50 are shown. Note that the curve of FIG. 6 is similar to the curve of FIG. 4 and has a sloped edge.

The present invention provides a more symmetrical head sensitivity function and a greater maximum output level than head sensitivity functions shown in FIG. 4 and 6 from prior art magnetoresistive sensors 10 and 22. The present invention switches the directions of the current density vector J and the magnetization vector M but retains the geometric form of the active region.

Figure 7:
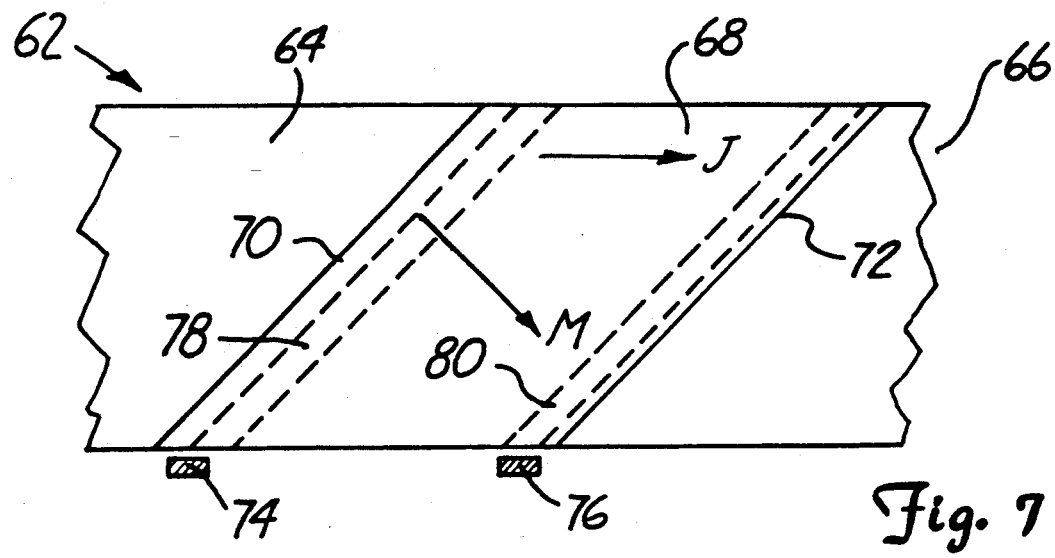
FIG. 7 is a diagram which shows a magnetoresistive sensor made in accordance with the present invention relative to a microtrack and the flux propagation path.

FIG. 7 shows a magnetoresistive sensor 62 in accordance with the present invention. Magnetoresistive sensor 62 includes a first electrical contact 64 and a second electrical contact 66 which sandwich active region 68. Active region 68 has a magnetization vector M and a current density vector J. The magnetization vector M and the current density vector J form an angle of about 45°. Note that the magnetization vector M and the current density vector J of magnetoresistive sensor 62 of FIG. 7 are interchanged in comparison to the M and J vectors of FIG. 2. First electrical contact 64 of FIG. 7 includes an edge 70 adjacent active region 68. Second electrical contact 66 includes an edge 72 adjacent active region 68.

FIG. 7 shows a microtrack at positions at 74 and 76. Microtrack position 74 causes a magnetic flux path 78 through active region 68 of magnetoresistive sensor 62. Microtrack position 76 causes a magnetic flux path 80 through active region 68.

Figure 8:
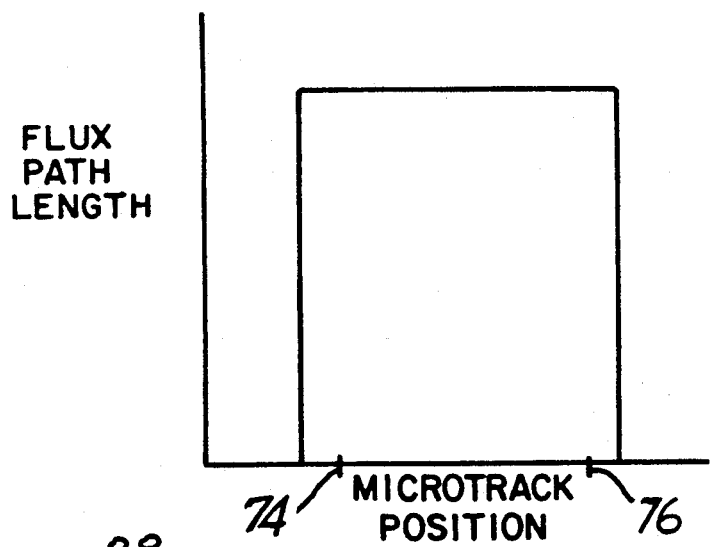
FIG. 8 is a graph of magnetic flux path length versus microtrack position for the magnetoresistive sensor of FIG. 7.

FIG. 8 is a graph which shows a curve of magnetic flux path length versus microtrack position for magnetoresistive sensor 62 of FIG. 7. In the case of magnetoresistive sensor 62, a microtrack propagating across active region 68 from edge 70 to edge 72 induces a magnetic flux path having a constant length. Thus, the curve of FIG. 8 has a steeper slope In FIG. 8, microtrack positions 74 and 76 are shown.

Figure 9:
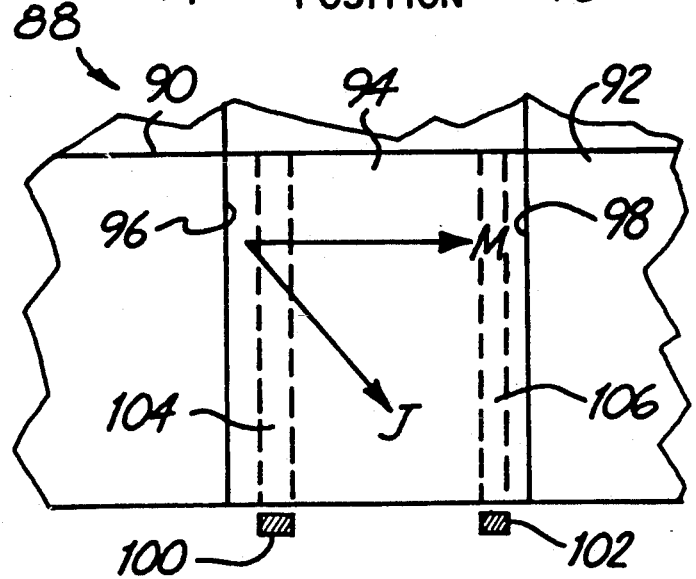
FIG. 9 is a diagram which shows another embodiment of a magnetoresistive sensor made in accordance with the present invention relative to a microtrack and the flux propagation path.

FIG. 9 shows a magnetoresistive sensor 88 in accordance with the present invention which uses a magnetization bias geometry. Magnetoresistive sensor 88 includes a first electrical contact 90 and a second electrical contact 92 which sandwich an active region 94. An interface between first electrical contact 90 and active region 94 forms an edge 96. An interface between second electrical contact 92 and active region 94 forms an edge 98. The magnetization vector M and the current density vector J of magnetoresistive sensor 88 of FIG. 9 are in the same orientation as M and J for magnetoresistive sensor 22 of FIG. 2, but the active area is no longer shaped with slanted contacts.

FIG. 9 also shows a microtrack at positions 100 and 102. Microtrack position 100 induces magnetic flux along a magnetic flux path 104 through active region 94 of magnetoresistive sensor 88. Microtrack position 102 induces magnetic flux along magnetic flux path 106 through active region 94. Both magnetic flux path 104 and magnetic flux path 106 are perpendicular to the magnetization vector M of active region 94.

Figure 10:
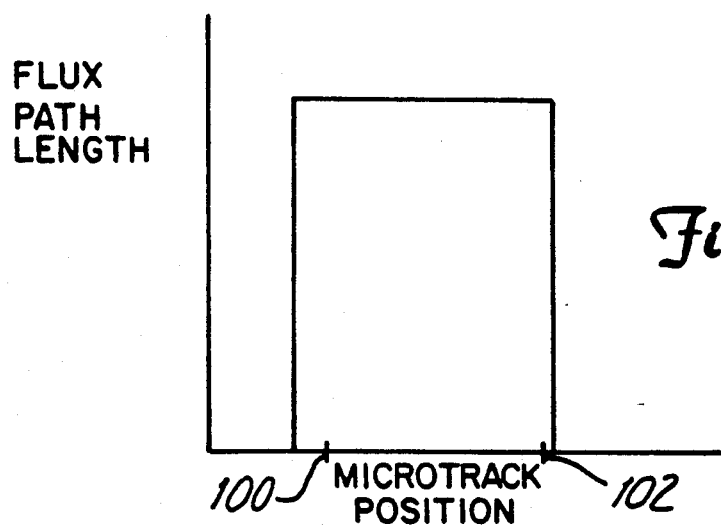
FIG. 10 is a graph of magnetic flux path length versus microtrack position for the magnetoresistive sensor of FIG. 9.

FIG. 10 shows a graph of magnetic flux path length versus microtrack position for magnetoresistive sensor 88 of FIG. 9. Again, as a magnetic flux source propagates across active region 94 between edge 96 and edge 98, it will generate a constant flux path length. This causes the curve of FIG. 10 to have squared edges. In the graph of FIG. 10, microtrack positions 100 and 102 are shown.

As shown in FIGS. 7 through 10, the microtrack scan provides a symmetrical shape. Additionally, the maximum signal, or output level is increased. Side fringing and magnetic decay length affects can be introduced, which may alter the degree of symmetry of the track scan and the amount of amplitude improvement. However, the head sensitivity function will be improved over prior art designs.

An additional benefit of magnetoresistive sensor 62 of FIG. 7 and magnetoresistive sensor 88 of FIG. 9 is that side fringing is reduced. With this, the magnetization vector M is normal to the magnetic boundary of the active region. In these designs, less flux can propagate into the active region from outside the active area.

Figure 11:
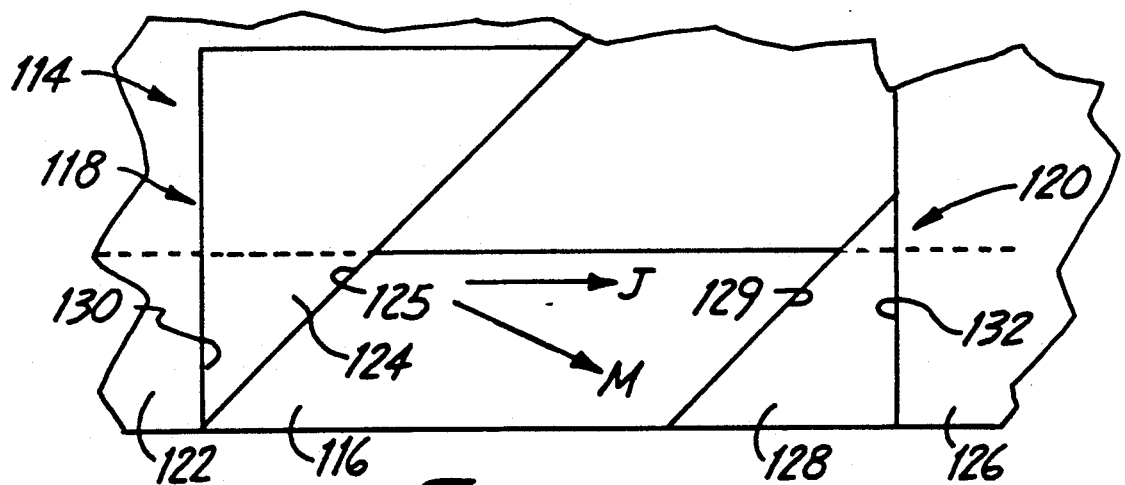
FIG. 11 is a diagram which shows a more detailed view of electrical contacts for a magnetoresistive sensor made in accordance with the present invention.
Figure 12:
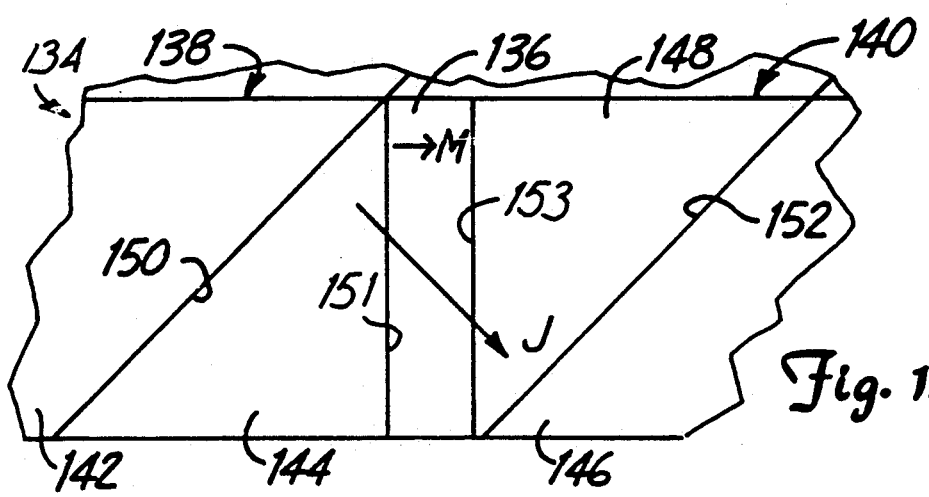
FIG. 12 is a diagram which shows a more detailed view of electrical contacts for another embodiment of a magnetoresistive sensor made in accordance with the present invention.

The present invention can use a number of techniques to obtain the desired orientation of the magnetization vector M and the current density vector J. FIGS. 11 and 12 are examples of techniques for obtaining the desired magnetization and current density vectors M and J, in accordance with the present invention.

FIG. 11 shows a magnetoresistive sensor 114 in accordance with the present invention. Magnetoresistive sensor 114 includes a parallelogram active region 116 having slanted sides. A first electrical contact 118 and a second electrical contact 120 lie on either side of active region 116. Biasing the magnetization vector M can be achieved using the previously described techniques. However, in addition to biasing the magnetization vector M, the current density vector J must be directed straight through active region 116 of magnetoresistive sensor 114, in accordance with the present invention. The current density vector J is along a longitudinal axis of active region 116. Directing the current density vector J is achieved in magnetoresistive sensor 114 of FIG. 11 through characteristics of electrical contacts 118 and 120.

First and second electrical contacts 118 and 120 include low resistance regions and high resistance regions. First electrical contact 118 includes a low resistance region 122 and a high resistance region 124. Similarly, second electrically contact 120 includes a low resistance region 126 and a high resistance region 128. High resistance region 124 forms a slanted edge 125 with active region 116. High resistance region 128 forms a slanted edge 129 with active region 116. Low resistance regions 122 and 126 may comprise a material having low resistance or may be formed using relatively thick contact material. High resistance regions 124 and 128 may be formed using high resistance material or by forming a relatively thin contact material in those regions. In FIG. 11, high resistance regions 124 and 128 are formed by depositing high resistance material over the magnetoresistive element to define edges 125 and 129 of active region 116. Low resistance regions 122 and 126 are formed by depositing low resistance material over portions of the material used to form high resistance regions 124 and 128.

For the current density vector J to be pointed along the axis of active region 116, the resistance of the slanted regions 124 and 128 which interface active region 116, should be approximately of the same order of magnitude as the magnetoresistive element. Additionally, high resistance regions 124 and 128 should not contribute to the readback signal. This is partially accomplished due to electrical shorting and may be enhanced by the use of an exchange material or by doping the active region under the contacts with a material that reduces the magnetoresistive effect. In the embodiment of FIG. 11, low resistance regions 122 and 126 cause the current density vector to run perpendicular to edges 130 and 132. However, edges 125 and 129 of high resistance regions do not significantly alter the direction of the current density vector J.

FIG. 12 shows a magnetoresistive sensor 134 having a rectangular active region, made in accordance with the present invention. Magnetoresistive sensor 134 includes a rectangular active region 136. Electrical contacts 138 and 140 lie on either side of active region 136. First electrical contact 138 includes a low resistance region 142 and a high resistance region 144. Second electrical contact 140 includes a low resistance region 146 and a high resistance region 148. An edge 150 is formed between low resistance region 142 and high resistance region 144 of first electrical contact 138. An edge 152 is formed between low resistance region 146 and high resistance region 148 of second electrical contact 140. An edge 151 is formed between high resistance region 144 and active region 136. An edge 153 is formed between high resistance region 148 and active region 136. High resistance regions 144 and 148 are formed by depositing high resistance material over the magnetoresistive element to form active region 136. Low resistance regions 142 and 146 are formed by depositing low resistance material over portions of the material used to form high resistance regions 144 and 148.

In magnetoresistive sensor 134 of FIG. 12, the magnetization vector M in active region 136 is directed along the length of magnetoresistive sensor 134. The current density vector J is rotated approximately 45° through the active region 136. Rotation of current density vector J is through the use of low resistance contacts 142 and 146 and high resistance contact 144 and 148. Slanted edges 150 and 152 direct the current density vector J at an angle through active region 136. Edges 151 and 153 do not significantly change the direction of J, yet help define active region 136. In the embodiment shown, slanted edges 150 and 152 lie outside of active region 136. High resistance regions 144 and 148 define active region 136. The magnetoresistive effect in high resistance regions 144 and 148 can be eliminated or reduced by selectively doping the regions or by reducing the permeability of the these regions with an exchange layer.

The present invention provides a magnetoresistive sensor having an improved head sensitivity function. The head sensitivity function of magnetoresistive sensors made in accordance with the present invention are narrower and have increased sensitivity than those of the prior art. The present invention achieves the desired head sensitivity function by providing a substantially constant magnetic flux path length as a microtrack propagates across the active region of the magnetoresistive sensing element. A magnetization vector M is perpendicular to magnetic flux entry and a current density vector J is at an angle of about 45° to the magnetization vector M. The present invention may be implemented with magnetoresistive sensors having both rectangular and parallelogram active regions. Achieving magnetization and current density vectors in accordance with the present invention may be through any appropriate means.

Although the present invention has been described with reference to preferred embodiments, workers skilled in the art will recognize that changes may be made in form and detail without departing from the spirit and scope of the invention.

What is claimed is:

1. A magnetoresistive sensor comprising:
   a magnetoresistive element having an active region, the active region having a magnetization vector;
   a first contact electrically coupled to the active region, the first electrical contact having an edge, a high resistance region adjacent the active region and a low resistance region spaced apart from the active region by the high resistance region;
   a second contact electrically coupled to the active region, the second electrical contact having an edge generally parallel with the edge of the first contact, a high resistance region adjacent the active region and a low resistance region spaced apart from the active region by the high resistance region; and
   wherein the magnetization vector of the active region is generally perpendicular to the edge of the first contact and the edge of the second contact.

2. The magnetoresistive sensor of claim 1 wherein:
   the active region is a parallelogram shape.

3. The magnetoresistive sensor of claim 2 wherein the edge of the first contact and the edge of the second contact are sloped with respect to a longitudinal axis of the active region.

4. The magnetoresistive sensor of claim 1 including a current density vector which forms an angle of about 45° with the magnetization vector in the active region of the magnetoresistive element.

5. The magnetoresistive sensor of claim 1 wherein:
   the active region has a rectangular shape.

6. The magnetoresistive sensor of claim 5 wherein the edge of the first contact and the edge of the second contact are parallel.

7. A magnetoresistive sensor comprising:
   a magnetoresistive element having an active region, the active region having a current density vector;
   a first contact electrically coupled to the active region, the first contact forming an edge with the active region and including a high resistance region adjacent the active region and a low resistance region spaced apart from the active region by the high resistance region;
   a second contact electrically coupled to the active region, the second electrical contact forming an edge with the active region which is generally parallel with the edge of the first contact and including a high resistance region adjacent the active region and a low resistance region spaced apart from the active region by the high resistance region; and
   wherein the current density vector in the active region forms an angle with the edge of the first contact and the edge of the second contact of about 45°.

8. The magnetoresistive sensor of claim 7 wherein:
   the active region is a parallelogram shape.

9. The magnetoresistive sensor of claim 8 wherein the edge of the first contact and the edge of the second contact are sloped with respect to a longitudinal axis of the active region.

10. The magnetoresistive sensor of claim 7 wherein the active region includes a magnetization vector which is generally perpendicular to the edge of the first contact and the edge of the second contact.

11. The magnetoresistive sensor of claim 7 wherein:
    the active region has a rectangular shape.

12. The magnetoresistive sensor of claim 11 wherein the edge of the first contact and the edge of the second contact are straight.

13. A magnetoresistive sensor comprising:
    an active region having a magnetization vector, the active region having a first edge and a second edge parallel the first edge and opposite the first edge;
    means for introducing an electrical current flow in the active region wherein the means for inducing a current flow comprises a first contact electrically coupled to the active region, the first contact including a high resistance region adjacent the active region and a low resistance region spaced apart from the active region by the high resistance region and a second contact electrically coupled to the active region, the second contact including a high resistance region adjacent the active region and a low resistance region spaced apart from the active region by the high resistance region; and wherein the magnetization vector is substantially perpendicular to the first and second edges of the active region and the current flow in the active region is in a direction which forms an angle of about 45° with the magnetization vector of the active region.

14. The magnetoresistive sensor of claim 13 wherein: the active region is a parallelogram shape.

15. The magnetoresistive sensor of claim 14 wherein the edge of the first contact and the edge of the second contact are sloped with respect to a longitudinal axis of the active region.

16. The magnetoresistive sensor of claim 13 wherein: the active region has a rectangular shape.

17. The magnetoresistive sensor of claim 16 wherein the edge of the first contact and the edge of the second contact are straight.

* * * * *